United States Patent [19]

Ambros et al.

[11] 4,319,217

[45] Mar. 9, 1982

[54] PRINTED CIRCUIT

[75] Inventors: Peter Ambros, Hohenroth; Erich Gatzke, Bad Neustadt, both of Fed. Rep. of Germany

[73] Assignees: Preh Elektrofeinmechanische Werke; Jacob Preh Nachf. GmbH & Co., both of Fed. Rep. of Germany

[21] Appl. No.: 22,843

[22] Filed: Mar. 22, 1979

[30] Foreign Application Priority Data

Mar. 22, 1978 [DE] Fed. Rep. of Germany ....... 2812497

[51] Int. Cl.³ ............................................ H01C 1/012
[52] U.S. Cl. ...................................... 338/308; 29/620; 219/543; 338/309; 338/327; 174/68.5
[58] Field of Search ............. 338/307, 308, 309, 22 R, 338/211, 283, 300, 327; 29/620, 621; 219/522, 543; 174/68.5

[56] References Cited

U.S. PATENT DOCUMENTS 3,358,362  12/1967  McElroy .............................. 29/621

FOREIGN PATENT DOCUMENTS

| 1640635 | 12/1970 | Fed. Rep. of Germany | 338/308 |
| 2044484 | 9/1973 | Fed. Rep. of Germany | 338/308 |
| 723437 | 6/1955 | United Kingdom | 338/308 |
| 862239 | 3/1961 | United Kingdom | 338/308 |
| 1108967 | 4/1968 | United Kingdom | 338/308 |
| 1351636 | 5/1974 | United Kingdom | 338/308 |
| 1376076 | 12/1974 | United Kingdom | 338/308 |
| 1377413 | 12/1974 | United Kingdom | 338/308 |
| 1409127 | 10/1975 | United Kingdom | 338/308 |
| 1482164 | 8/1977 | United Kingdom | 338/308 |

OTHER PUBLICATIONS

"Integrated Circuit Design Principles", pp. 256, 259, 260.

Primary Examiner—Volodymyr Y. Mayewsky
Attorney, Agent, or Firm—Wigman & Cohen

[57] ABSTRACT

The invention concerns a printed circuit with electrically conductive, solderable conductors and integrated resistance layers upon a nonconductive substrate, in certain surface patterns.

19 Claims, 1 Drawing Figure

U.S. Patent
Mar. 9, 1982
4,319,217
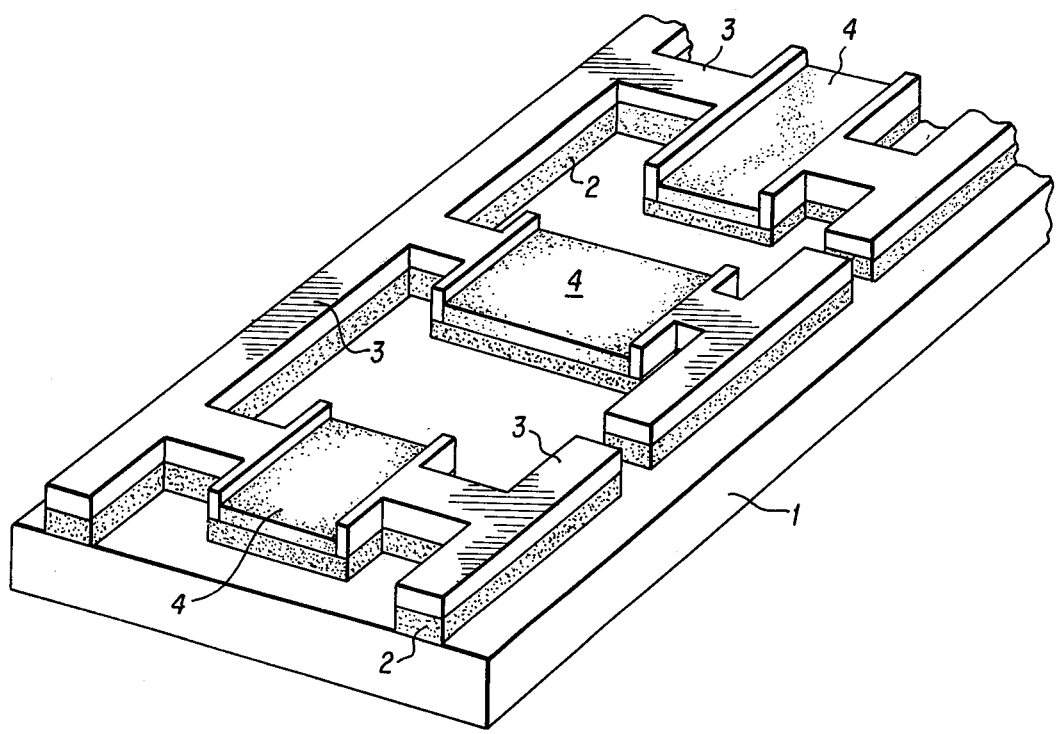

PRINTED CIRCUIT

BACKGROUND OF THE INVENTION

The manufacture of electric conduction paths using additive technology for various substrates such as phenolic resin or epoxide resin, moulded on laminated material is notoriously well-known. In all known processes using additive construction, a bonding agent is necessary, regardless of how the various processing stages differ from method to method; the adhesive agent is to assure the bonding between the substrate and the built-up additive metal layer, usually copper. This is particularly so when the conductors must be solderable, as is usually the case. The adhesive itself is a heat-hardenable adhesive which is generally based on an acrylonitrile-butadiene-copolymer, i.e., a nitrile-rubber which is hardened with a heat-reactive phenolic body. Such plastics are, depending on the known ABS plastics (Acrylonitrile-Butadiene-Styrene), also designated as ABP plastics (Acrylonitrile-Butadiene-Phenol).

Thus, a process for the manufacturing of a printed circuit is already known in which the substrate is coated with a layer of adhesive. This consists of a mixture of a hardenable resin such as, for example, epoxide or phenolic resin with a fine-grained additive of, for example, silicates or metallic oxides. The bonding agent layer is usually hardened partially or completely such that the bonding to the surface of the substrate is assured. Prior to the application of the conductive metal layer, the layer of bonding agent is subjected to a chemical decomposition process. The bonding agent layer can first be mechanically roughened. The particles of additive are lightly abraded and are then separated during the subsequent decomposition process without attacking the resin portion. In this way, a surface which has holes and undercuts is created. Upon this surface a conductive metallic layer is applied using galvanic processes. The chemical decomposition process takes place using either caustic soda, weak acids, or organic solvents. This process step entails a loss of the etching materials necessary for the decomposition, not to mention the waste water problems. Furthermore, exact controls are necessary throughout the bath process, along with frequent bath rejuvenation.

Another known process using additive technology for manufacturing a printed circuit is one in which a bonding agent is located between the copper layer and the substrate. This consists of acrylonitrile-butadiene and phenolic resins suspended in methylethyl ketone. After a drying time of 2.5 hours at 140° C., the bonding agent exhibits a surface resistance of $10^5$ to $10^8$ Mohm. Prior to coppering, the bonding agent is lightly etched via a mixture of sulfuric acid, water, and chromic acid. As a result of this activation, the butadiene component is more rapidly attacked (oxidized) than both other components. In those places where a butadiene chain is located, there thus arises a molecular hole, which can subsequently be used to anchor the chemically deposited copper.

SUMMARY OF THE INVENTION

The purpose of the present invention is to find a simple, additive-technology process for the manufacture of a printed circuit of the type noted initially—one in which the resistance layers are variable within a wide area of specific resistance and at the same time serve as a good bonding agent for the solderable conductors.

In the instant invention, this problem is solved by using resistance layers which serve as bonding agents and are located under the conductive paths. These resistance layers consist of an organic bonding agent comprising fire-resistant particles which determine the resistance value and/or carbon black or graphite and catalysts effective for chemical metal deposit coated with up to 1-50 wt. % pyrolytic carbon and having a size of less than 20 μm.

BRIEF DESCRIPTION OF THE DRAWING

The single FIGURE is a perspective view of the structure of the instant inventive circuit board and circuits thereon.

DETAILED DESCRIPTION OF THE INVENTION

As an organic bonding agent for the resistance layers, mixtures of caprolactam-blocked polyurethane with silicon resins and/or acetal resins and/or vinyl chloride-vinyl acetate copolymers and/or saturated polyester can be utilized. Additionally, the bonding agent can be a caprolactam-blocked adduct of isoporondiisocyanate and a oxyester containing hydroxyl groups. To increase the temperature coefficient, a mixture of melamine formaldehyde alkyd resin and/or an epoxide resin can be admixed to the bonding agent. If the weight ratio is approximately 1:1, a TK-value of +500 ppm/°C. is reached. If the composition is altered in the direction of an increased portion of melamine formaldehyde alkyd resin and/or epoxide resin ester, TK values up to −500 ppm/°C. can be reached.

The resistance value or specific resistance of the resistance layer depends upon the type and packing density of the electrically conductive fire-resistant particles in the bonding agent. These particles are coated with pyrolytic carbon and may consist of aluminum phosphate, aluminum oxide, silicon dioxide, titanium dioxide, iron carbide, tin oxide, lead oxide, chromic III oxide, talc, ferrite and/or basalt. As conductive particles, carbon black or graphite can be admixed to the bonding agent.

Additionally, the bonding agent comprises catalysts which become effective for the chemical metal deposit of the conductive paths, i.e., the conductors. By the expression "catalytic", it is meant a material which brings about the metal deposit via chemical baths. Such fillers form catalytically functioning centers on the surface and in the porous system of the bonding agent; these centers allow a well-bonding metal layer to build up in a chemically or galvanically functioning bath. Metals or metallic compounds from the copper and/or platinum groups are used as catalysts. The catalysts can be admixed to the bonding agent independently of the fire-resistant particles coated with pyrolytic carbon. On the other hand, these carbon coated particles can also be inoculated with the catalysts. This can be done in such a way that, for example, the filler can be dipped as bulk material into a solution which contains metals of the copper or platinum group. Here, on the filler particles, inoculators of metals or metal compounds are deposited. In the place of metals of the named groups, other metals can also be used for inoculating the filler. The choice of such metals is made based on the metal deposit solution to be subsequently used. The metallic compounds of copper, such as cuprous oxide or copper sulfate, are however particularly well suited as catalysts for copper metalization. Preferably, inoculation the filler materials is carried out in such a way that loading particles are impregnated with a cuprous chloride solution, the cuprous chloride absorbed on the filler particle surface being transferred into cuprous oxide—virtually insoluble in water—via for example, NaOH.

As already mentioned, the resistance value depends upon of the type and packing density of the electrically conductive particles in the bonding agent. With the above-described particles, resistant layers can be manufactured whose specific resistance varies between 0.5 and 4000 Ω. cm.

The printed circuits are manufactured in such a way that, first the resistance layers are applied via additive technology in certain surface patterns onto the substrate, preferably using screen process printing. Thus the areas which serve for resistors and conductors are given a resistance layer. For the subsequent manufacture of the conductive paths, there are two possibilities.

The first possibility is to cover the areas of the substrate which are coated with the resistance layer and are to serve for resistors only, with a lacquer which resists metalization. This is followed by the application of conductive paths via currentless and/or galvanic baths, whereby the portions of the resistance layer not coated with lacquer are plated with copper, nickel, tin, silver or gold so that, since these layers have lower resistance than the resistance layer, solderable conductors are created. Thus, the places on the printed circuit which have an additively deposited metallic layer have the function of a conductor, while the areas where the metal deposit was prevented have the function of layer resistors.

The second possibility is to cover all areas of the substrate which have a resistance layer with an additional conductive layer. Then the areas which are to serve as conductors are covered with an etch-resistant lacquer, and the conductive layer is then etched away where resistors are to be formed so that only in those places does the resistance layer remain.

To influence the specific resistance value, additional particles less than 15 $\mu$m in size consisting of molybdenum, nickel, lead, silver, gold and/or mixtures thereof can be admixed to the bonding agent.

The finished printed circuit board is shown in the drawing FIGURE. To construct this printed circuit, a resistance layer 2 is applied to a substrate 1. Then, when following the first alternative method, the areas of the substrate 1 which are to serve as resistors are coated with a lacquer coating 4. That is, a lacquer coating 4 is applied to the resistance layer 2 where it is desired to form resistors. The circuit board is then placed in a currentless and/or galvanic bath and the portions of the resistance layer 2 which were not coated with lacquer coating 4 are plated with the desired metal to form conductive paths 3.

When using the second alternative method, the resistance layer 2 has a conductive layer applied thereto. Then, those areas which are to serve as conductive paths 3 are covered with an etch-resistant lacquer coating 4. The conductive layer is then etched away where no lacquer coating 4 was applied which corresponds to the areas where resistors are to be formed. Thus, the resistance layer 2 remains only in those areas. The portions of the conductive layer that remain after etching form the conductive paths 3.

We claim:

1. An electrical printed circuit, comprising:
an electrically nonconductive substrate;
integrated resistance layers formed on said substrate and having surface patterns thereon;
electrically conductive solderable circuit paths formed on certain surface patterns on said integrated resistance layers;
said integrated resistance layers include an organic bonding agent comprising particles which are less than 20 $\mu$m in size; and
said particles comprising an electrically conducting material taken from the group consisting of pyrolytic carbon, carbon black, graphite or mixture thereof, and catalysts effective for chemical metal deposit.

2. The printed circuit, as in claim 1, wherein said organic bonding agent is a caprolactam-blocked adduct of isoporondiisocynate and oxyester containing hydroxyl groups.

3. The printed circuit, as in claim 1, wherein said organic bonding agent is one or more of a caprolactam-blocked adduct of isoporondiisocyanate and oxyester containing hydroxyl groups, and a mixture from at least one of a melamine formaldehyde-alkyd resin and an epoxide resin ester.

4. The printed circuit, as in claim 1, wherein said particles are fire-resistant particles taken from the group consisting of aluminum phosphate, aluminum oxide, silicon dioxide, titanium oxide, iron carbide, tin oxide, lead oxide, chromic oxide, talc, ferrite and basalt.

5. The printed circuit, as in claim 1, wherein the particles including effective catalysts comprise one of materials and metal compounds of the copper and platinum group.

6. The printed circuit, as in claim 1, wherein said particles are fire-resistant particles inoculated with the effective catalysts.

7. The printed circuit, as in claim 1, wherein the areas of the nonconductive substrate serve for conductors and resistors and have metalized sections, and further characterized by the fact that the areas that serve for conductors are coated with an etching-resistant lacquer, and that the metalized sections are removed from the areas that serve for resistors.

8. The printed circuit according to claims 1 or 4 wherein said particles are coated with pyrolytic carbon in an amount ranging from 1–50% by weight.

9. The printed circuit according to claims 1 or 4 wherein said catalysts are deposited on said particles.

10. The printed circuit according to claim 1 wherein said particles are carbon black.

11. The printed circuit according to claim 1 wherein said particles are graphite.

12. The printed circuit according to claims 1 or 4 wherein said organic bonding agent is taken from the group consisting of caprolactam-blocked polyurethane-silicone resins, acetate resins, vinyl chloride-vinyl acetate copolymers, polyesters, melamine formaldehyde-alkyl resins, epoxide resins or mixtures thereof.

13. The printed circuit according to claims 1 or 4 wherein said catalysts are taken from the group consisting of metals and metal compounds.

14. The printed circuit according to claim 1 wherein the integrated resistance layers have a resistance value ranging from 0.5 to 4000 ohms.cm.

15. The printed circuit according to claim 1 wherein said electrically conductive solderable circuit paths are plated with a metal taken from the group consisting of copper, nickel, tin, silver and gold.

16. The printed circuit according to claim 15 wherein said metal is deposited electrolytically or by electroless deposition.

17. The printed circuit according to claim 15, wherein said integrated resistance layers include a lacquer coating to resist metal plating thereon.

18. The printed circuit according to claims 1 or 12 wherein said bonding agents include admixed metal particles.

19. The printed circuit according to claim 18 wherein said metal particles are less than 15 μm in size and are taken from the group consisting of molybdenum, nickel, lead, silver, gold, and mixtures thereof.

* * * * *